(12) United States Patent
Zuck et al.

(10) Patent No.: US 6,936,114 B1
(45) Date of Patent: *Aug. 30, 2005

(54) STEAM CLEANING SYSTEM AND METHOD FOR SEMICONDUCTOR PROCESS EQUIPMENT

(75) Inventors: David S. Zuck, Chandler, AZ (US); Kurtis R. Macura, Colorado Springs, CO (US)

(73) Assignee: Quantum Global Technologies, LLC, Dublin, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/664,351

(22) Filed: Sep. 16, 2003

Related U.S. Application Data

(63) Continuation of application No. 09/879,412, filed on Jun. 11, 2001, now Pat. No. 6,648,982.

(51) Int. Cl.[7] .................................................. B08B 3/00
(52) U.S. Cl. ................... 134/30; 134/22.1; 134/22.11; 134/22.12; 134/22.15; 134/22.18; 134/31; 134/36; 134/34; 134/37; 134/102.1
(58) Field of Search .......................... 134/22.1, 22.11, 134/22.12, 22.15, 22.18, 36, 30–31, 34, 37, 134/102.1

(56) References Cited

U.S. PATENT DOCUMENTS

| | | | |
|---|---|---|---|
| 4,083,946 A | 4/1978 | Schurr et al. | 423/613 |
| 5,172,728 A | 12/1992 | Tsukazaki | 137/637.2 |
| 5,356,482 A * | 10/1994 | Mehta et al. | 134/22.1 |
| 5,545,289 A | 8/1996 | Chen et al. | 438/694 |
| 6,146,469 A | 11/2000 | Toshima | 134/37 |
| 6,460,552 B1 | 10/2002 | Lorimer | 134/148 |

FOREIGN PATENT DOCUMENTS

| | | |
|---|---|---|
| EP | 0489179 A1 | 5/1992 |
| JP | 407273078 A | 10/1995 |

OTHER PUBLICATIONS

CRC Handbook of Chemistry and Physics, A Ready-Reference Book of Chemical and Physical Data, cover sheet, 8-102 and 8-103. 1999-2000, 80th edition. CRC Press (Boca Raton, London, New York, and Washington D.C.).

* cited by examiner

*Primary Examiner*—Sharidan Carrillo
(74) *Attorney, Agent, or Firm*—Silicon Edge Law Group LLP; Arthur J. Behiel

(57) ABSTRACT

Disclosed are systems and methods for removing stubborn contaminants, aluminum fluoride and aluminum chloride in particular, from components of semiconductor-processing equipment. One embodiment forces steam through small holes in a gas distribution plate to remove build up on the interior walls of the holes. A cleaning fixture disposed between the steam source and the gas distribution plate delivers the steam at increased pressures. The gas distribution plate can be immersed in water during cleaning to capture the exiting steam.

22 Claims, 1 Drawing Sheet

STEAM CLEANING SYSTEM AND METHOD FOR SEMICONDUCTOR PROCESS EQUIPMENT

This application is a continuation of application Ser. No. 09/879,412 filed Jun. 11, 2001, now U.S. Pat. No. 6,648,982.

FIELD OF THE INVENTION

This invention relates generally to methods and apparatus for cleaning semiconductor-processing equipment.

BACKGROUND

Semiconductor devices are built up using a number of silicon compound and metal material layers. Some layers can be grown from another layer; for example, an insulating layer of silicon oxide can be grown over a layer of silicon by oxidizing the silicon surface. Other layers are deposited using various techniques, such as vacuum evaporation, sputtering, and chemical vapor deposition (CVD). The layers are patterned with photoresists to remove selected portions. The remaining material forms circuit features that will eventually make up an integrated circuit.

Metal etch processes commonly employ halogen etch gases, such as chlorine and bromine gas. Silicon etch processes also employ halogen etch gases, such as nitrogen trifluoride, sulfur hexafluoride, and tetrafluoromethane. Halogen and halogen-bearing etch gases react with aluminum surfaces of process equipment to form halogen etch contaminants, such as aluminum fluoride and aluminum chloride.

Halogen etch contaminants and other process byproducts collect on interior surfaces of process equipment. Thus, after substantial use, contaminant films accumulate on components and surfaces within the reaction chamber. As these films grow inside the chamber, they become increasingly troublesome sources of contaminants. The reaction chamber, including internal components, must therefore be periodically cleaned or replaced.

Halogen etch contaminants are difficult to remove. This difficulty is exacerbated when the contaminated surfaces are difficult to access. Aluminum electrodes that double as gas-distribution plates (commonly known as "showerheads") are particularly difficult to clean. Showerheads typically include tens to hundreds of very small holes that become clogged with aluminum fluoride or aluminum chloride during etch processes that employ fluorine or chlorine gas species. Showerheads manufactured by Applied Materials and Tokyo Electron Limited are typical.

There are two common types of showerheads. In the first type, the entire electrode surface, including within the holes, is anodized aluminum. In the second type, each hole includes a VESPEL insert. VESPEL is a type of plastic that inhibits formation of contaminants to minimize the need for cleaning.

Showerheads with anodized aluminum holes are conventionally cleaned by bead blasting. In this laborious process, the perforated surface of a showerhead is "masked" prior to bead blasting with a plate that has precision-drilled holes matching the holes in the showerhead. Unfortunately, bead blasting removes some of the anodized material from the showerhead, reducing the useful life of expensive components. Moreover, bead blasting produces excessive particulate contamination from the component surface and blast media.

Showerheads with inserts are conventionally cleaned by $CO_2$ blasting. This method is similar to bead blasting, but the beads are substituted with $CO_2$ ice particles that collide with and remove aluminum fluoride, aluminum chloride, and other contaminants. The effectiveness of this method reduces with holes size, making it difficult or impossible to properly clean showerheads. Carbon dioxide is also used on anodized aluminum holes to remove loose contaminants, but is ineffective at removing aluminum chloride or aluminum fluoride chemically bound to aluminum surfaces.

SUMMARY

The invention is directed to systems and methods for removing stubborn contaminants from semiconductor-processing equipment. One embodiment of the invention forces steam through small holes in a gas distribution plate to remove build up on the interior walls of the holes. This procedure works particularly well in removing halogen etch contaminants from aluminum surfaces without unnecessarily damaging the underlying component.

In one embodiment, a cleaning fixture disposed between a steam source and a contaminated component directs steam through holes in the component. Steam cleaning may work better at increased steam pressures. The cleaning fixture can thus be sealed against the component to force pressurized steam through the holes. Such embodiments can include a pressure-relief valve to prevent excessive pressure from building up between the fixture and the component.

In another embodiment of the invention, all or a portion of the component undergoing the steam-cleaning process is immersed in a bath. Steam immerging from the component during the cleaning process may thus be directed into the bath. This embodiment improves operator safety by condensing the steam as it immerges from the component, reducing the amount of potentially dangerous steam escaping into the surrounding area.

The claims, and not this summary, define the scope of the invention.

DETAILED DESCRIPTION

Figure 1:
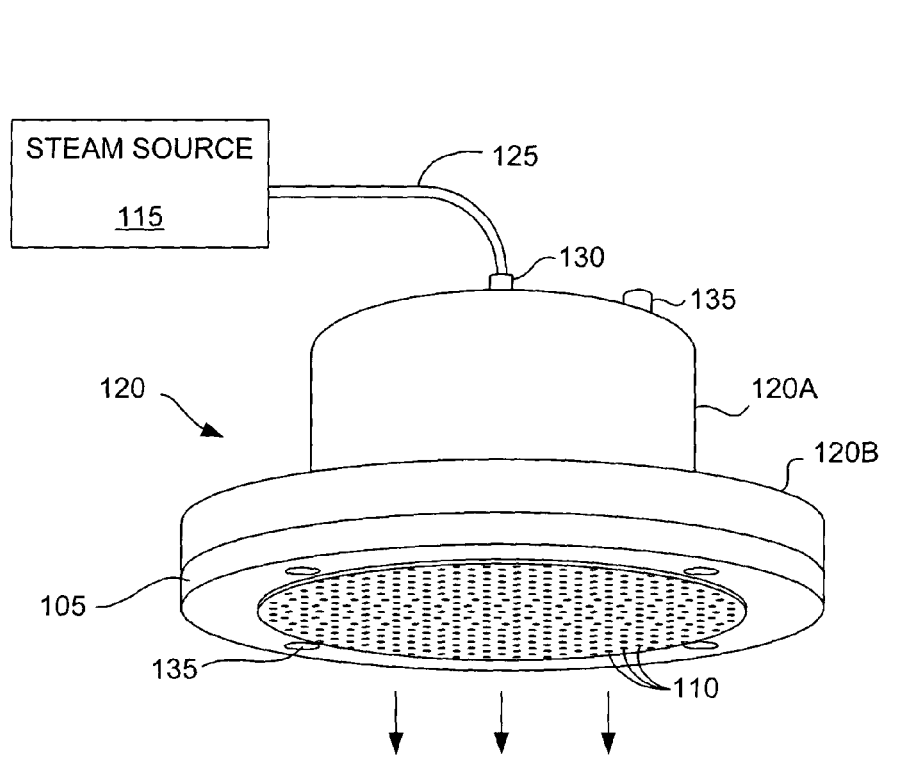
FIG. 1 depicts a cleaning system 100 for cleaning semiconductor-processing equipment in accordance with an embodiment of the present invention.

FIG. 1 depicts a cleaning system 100 for cleaning semiconductor-processing equipment in accordance with an embodiment of the present invention. In the example, system 100 is adapted to remove halogen etch contaminants, such as aluminum fluoride and aluminum chloride, from a conventional showerhead 105. System 100 is particularly effective for removing halogen etch contaminants from the interior surfaces of small holes, or channels, 110.

System 100 includes a steam source 115 connected to a cleaning fixture 120 via a steam line 125 and a pipe fitting 130. Cleaning fixture 120 includes a body portion 120A and a component interface 120B. Interface 120B attaches to showerhead 105 using, for example, bolt holes 135 in showerhead 105 using any appropriate hardware. Cleaning fixture 120 optionally includes a conventional pressure-relief valve 135 to prevent excessive pressure from building up between fixture 120 and showerhead 105.

A steam generator for use as steam source 115 is, in one embodiment, a Platinum Series ENG4-2000 pressure Washer from Landa, Inc., of Camus, Wash. Steam source 115 produces hot water, steam, or a combination of the two. Both liquid water and steam (collectively "water") can be used to remove contaminants such as aluminum fluoride, though steam is preferred.

System 100 cleans showerhead 120 by forcing water through channels 110 via steam source 115, line 125, fitting 130, and fixture 120. The steam within fixture 120 is, in one embodiment, delivered from steam source 115 at a pressure of between 2000 and 2500 psig and a temperature above 212 degrees Fahrenheit, e.g., 300 degrees Fahrenheit. Higher temperatures and pressures increase the reaction and salvation rates important for rapid cleaning.

Steam source 115 can be adapted to provide various types of steam. For example, oxidizing agents, such as hydrogen peroxide, or reducing agents, such as ionized hydrogen, may be added to the steam. In one embodiment, up to two percent hydrogen peroxide is added to the water in steam source 115.

Steam pressure produces significant force across the inside face of showerhead 120. Too much force can be dangerous to operators and equipment, so pressure-relief valve 135 is adapted to control the pressure to a level at or below a desired maximum level, 50 psig in one example. Higher pressures may clean better, but the capability of steam source 115, the related plumbing, the sensitivity of the components being cleaned, and operator safety should also be considered in determining an appropriate pressure for a given cleaning process.

Figure 2:
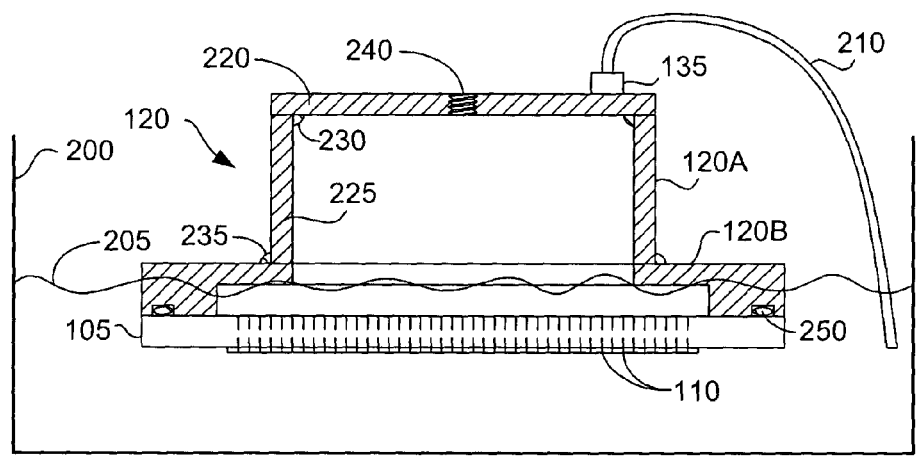
FIG. 2 depicts fixture 120 of FIG. 1 in cross-section.

FIG. 2 depicts the combination of showerhead 105 and fixture 120 partially immersed in a tub 200 of water 205. Steam immerging from channels 110 may be dangerously hot, and the resulting clouds of vapor my reduce visibility. Submersing at least the external face of showerhead 105 in relatively cool water 205 ameliorates these problems because the steam cools and condenses upon immerging from channels 110 into water 205. The output of pressure-relief valve 135 can also be directed into water 205, via e.g. a tube 210, to further reduce problems associated with escaping steam. In one embodiment, water 205 is de-ionized water that includes from zero to two percent hydrogen peroxide to assist the cleaning process.

Fixture 120 is shown in cross-section in FIG. 2. In this embodiment, fixture 120 includes three pieces of aluminum or stainless steel: a top plate 220, interface portion 120B, and a cylindrical section 225. These three pieces are attached to one another via a pair of circular welds 230 and 235. Fixture 120 additionally includes a pipe-threaded steam inlet 240, pressure-relief valve 135, and tubing 210 for directing steam released from valve 135 into water 205. An optional O-ring 250 and corresponding recess in interface 120B improves the seal between interface 120B and showerhead 105.

The above-described cleaning procedures are enhanced, in some embodiments, by presoaking the component to be cleaned in hot (e.g., 180 to 200 degrees Fahrenheit) water. Presoaking can be done more quickly in hotter water, so parts can benefit from presoaking at pressures greater than one atmosphere to allow presoak temperatures in excess of 212 degrees Fahrenheit. In one embodiment, the presoak solution is de-ionized water that includes from zero to two percent hydrogen peroxide. The presoak solution can be agitated using any number of well-know methods. In some cases, the soaking process may clean the component sufficiently to avoid the need for cleaning processes of the type described in connection with FIGS. 1 and 2.

While the present invention has been described in connection with specific embodiments, variations of these embodiments will be obvious to those of ordinary skill in the art. For example, the invention is not limited to showerheads, but may be used to clean other components with hard-to-reach surfaces. Moreover, steam need not be directed through channels in process equipment, but may also be directed at exposed contaminated surfaces to remove aluminum fluoride, etc. In another embodiment, ionized hydrogen and nitrogen are used in conjunction with steam cleaning. For example, a three percent solution of hydrogen and nitrogen is run though an ionizer and directed, with steam, at contaminated surfaces. Therefore, the spirit and scope of the appended claims should not be limited to the foregoing description.

What is claimed is:

1. A method for removing reaction products of aluminum and a halogen from semiconductor process equipment, the method comprising forcing steam through holes in the semiconductor process equipment to remove the reaction products from the holes.

2. The method of claim 1, wherein the halogen is fluorine.

3. The method of claim 1, wherein the steam is of a steam pressure above one atmosphere.

4. The method of claim 1, wherein the steam is of a steam temperature above 212 degrees Fahrenheit.

5. The method of claim 1, wherein the equipment comprises a gas diffusion plate perforated with the holes.

6. The method of claim 1, further comprising soaking the equipment prior to forcing the steam through the holes.

7. The method of claim 6, wherein equipment is soaked in water.

8. The method of claim 6, wherein the equipment is soaked at a pressure greater than one atmosphere.

9. The method of claim 7, wherein the water is above 180 degrees Fahrenheit.

10. A method for removing reaction products of aluminum and a halogen from a component of semiconductor process equipment, the component having at least one component channel contaminated with the reaction product, the method comprising:
 a. providing a steam source that produces steam at a pressure greater than atmospheric pressure; and
 b. directing the steam through the channel, the steam removing the reaction products of aluminum and the halogen from the channel of the component of the semiconductor process equipment.

11. The method of claim 10, wherein the halogen is fluorine.

12. The method of claim 10, wherein the steam is of a steam temperature of above 212 degrees Fahrenheit.

13. The method of claim 10, wherein the equipment comprises a gas diffusion plate, and wherein the channel comprises a hole perforating the diffusion plate.

14. The method of claim 10, further comprising soaking the component prior to directing the steam through the channel.

15. The method of claim 10, further comprising directing a reducing agent with the steam.

16. The method of claim 10, wherein the component comprises aluminum.

17. The method of claim 10, wherein the reaction product comprises a layer formed during a semiconductor etch process.

18. The method of claim 14, wherein the component is soaked in water.

19. The method of claim 15, wherein the reducing agent includes at least one of ionized hydrogen and ionized nitrogen.

20. The method of claim 17, wherein the semiconductor process equipment processes semiconductor devices having silicon and metal layer.

21. The method of claim 18, wherein the water is above 180 degrees Fahrenheit.

22. The method of claim 21, wherein the equipment is soaked at a pressure greater than one atmosphere.

* * * * *